(12) United States Patent
Granger-Jones et al.

(10) Patent No.: US 12,170,515 B2
(45) Date of Patent: Dec. 17, 2024

(54) REVERSED SEMILATTICE FILTER

(71) Applicant: Qorvo US, Inc., Greensboro, NC (US)

(72) Inventors: Marcus Granger-Jones, Scotts Valley, CA (US); Yazid Yusuf, Orlando, FL (US)

(73) Assignee: Qorvo US, Inc., Greensboro, NC (US)

( * ) Notice: Subject to any disclaimer, the term of this patent is extended or adjusted under 35 U.S.C. 154(b) by 281 days.

(21) Appl. No.: 17/588,836

(22) Filed: Jan. 31, 2022

(65) Prior Publication Data

US 2023/0246633 A1 Aug. 3, 2023

(51) Int. Cl.
*H03H 9/54* (2006.01)
*H03H 9/205* (2006.01)

(52) U.S. Cl.
CPC ............ *H03H 9/542* (2013.01); *H03H 9/205* (2013.01); *H03H 9/547* (2013.01)

(58) Field of Classification Search
CPC ........ H03H 9/542; H03H 9/205; H03H 9/547; H03H 7/1775; H03H 9/60; H03H 7/09
See application file for complete search history.

(56) References Cited

U.S. PATENT DOCUMENTS

| | | | |
|---|---|---|---|
| 3,731,230 A | 5/1973 | Cerny, Jr. | |
| 3,875,533 A | 4/1975 | Irwin et al. | |
| 4,442,434 A | 4/1984 | Baekgaard | |
| 4,577,168 A | 3/1986 | Hartmann | |
| 5,291,159 A | 3/1994 | Vale | |
| 5,821,833 A | 10/1998 | Lakin | |
| 6,067,391 A | 5/2000 | Land | |
| 6,670,866 B2 | 12/2003 | Ellaet et al. | |
| 6,714,099 B2 | 3/2004 | Hikita et al. | |
| 6,720,844 B1 | 4/2004 | Lakin | |
| 6,927,649 B2 | 8/2005 | Metzger et al. | |
| 6,927,651 B2 | 8/2005 | Larson et al. | |
| 6,975,183 B2 | 12/2005 | Aigner et al. | |
| 7,057,478 B2 | 6/2006 | Korden et al. | |
| 7,173,504 B2 | 2/2007 | Larson, III et al. | |

(Continued)

FOREIGN PATENT DOCUMENTS

| | | |
|---|---|---|
| CN | 101154934 A | 4/2008 |
| CN | 104883153 A | 9/2015 |

(Continued)

OTHER PUBLICATIONS

Office Action for Japanese Patent Application No. 2018181230, mailed Sep. 14, 2022, 9 pages.

(Continued)

*Primary Examiner* — Andrea Lindgren Baltzell
*Assistant Examiner* — Kimberly E Glenn
(74) *Attorney, Agent, or Firm* — Withrow & Terranova, P.L.L.C.

(57) ABSTRACT

Reversed semilattice filters with improved common mode rejection characteristics are disclosed. In one aspect, a filter may include two interior nodes coupled with an impedance that treats unwanted signals as common mode signals and provides rejection for common mode signals while passing differential signals of interest. The impedance is modified to have a resonant circuit that improves signal rejection in the stop band by lowering the effective impedance at those frequencies while leaving the pass band unaffected.

19 Claims, 9 Drawing Sheets

(56) References Cited

U.S. PATENT DOCUMENTS

| | | |
|---|---|---|
| 7,239,067 B2 | 7/2007 | Komuro et al. |
| 7,321,183 B2 | 1/2008 | Ebuchi et al. |
| 7,342,351 B2 | 3/2008 | Kubo et al. |
| 7,367,095 B2 | 5/2008 | Larson, III et al. |
| 7,391,285 B2 | 6/2008 | Larson, III et al. |
| 7,436,269 B2 | 10/2008 | Wang et al. |
| 7,515,018 B2 | 4/2009 | Handtmann et al. |
| 7,804,374 B1 | 9/2010 | Brown et al. |
| 7,825,749 B2 | 11/2010 | Thalhammer et al. |
| 7,855,618 B2 | 12/2010 | Frank et al. |
| 7,889,024 B2 | 2/2011 | Bradley et al. |
| 7,898,493 B1 | 3/2011 | Rojas et al. |
| 7,956,705 B2 | 6/2011 | Meister et al. |
| 7,973,620 B2 | 7/2011 | Shirakawa et al. |
| 8,130,058 B2 | 3/2012 | Cardona et al. |
| 8,248,185 B2 | 8/2012 | Choy et al. |
| 8,508,315 B2 | 8/2013 | Jamneala et al. |
| 8,575,820 B2 | 11/2013 | Shirakawa et al. |
| 8,576,024 B2 | 11/2013 | Erb et al. |
| 8,923,794 B2 | 12/2014 | Aigner |
| 8,981,627 B2 | 3/2015 | Sakuma et al. |
| 8,991,022 B2 | 3/2015 | Satoh et al. |
| 9,054,671 B2 | 6/2015 | Adkisson et al. |
| 9,054,674 B2 | 6/2015 | Noue et al. |
| 9,197,189 B2 | 11/2015 | Miyake |
| 9,243,316 B2 | 1/2016 | Larson, III et al. |
| 9,484,883 B2 | 11/2016 | Nishizawa et al. |
| 9,698,756 B2 | 7/2017 | Khlat et al. |
| 9,837,984 B2 | 12/2017 | Khlat et al. |
| 9,847,769 B2 | 12/2017 | Khlat et al. |
| 9,887,686 B2 | 2/2018 | Kuwahara |
| 9,906,206 B2 | 2/2018 | Shih et al. |
| 9,929,716 B2 | 3/2018 | Lee et al. |
| 10,009,001 B2 | 6/2018 | Jiang et al. |
| 10,141,644 B2 | 11/2018 | Khlat et al. |
| 11,444,642 B2 | 9/2022 | Wang |
| 2002/0109564 A1 | 8/2002 | Tsai et al. |
| 2004/0100342 A1 | 5/2004 | Nishihara et al. |
| 2004/0140869 A1 | 7/2004 | Marksteiner et al. |
| 2004/0227590 A1 | 11/2004 | Larson, III et al. |
| 2004/0263286 A1 | 12/2004 | Unterberger |
| 2005/0057117 A1 | 3/2005 | Nakatsuka et al. |
| 2005/0093648 A1 | 5/2005 | Inoue |
| 2005/0206476 A1 | 9/2005 | Ella et al. |
| 2006/0091978 A1 | 5/2006 | Wang et al. |
| 2006/0232361 A1 | 10/2006 | Wang et al. |
| 2008/0007369 A1 | 1/2008 | Barber et al. |
| 2008/0169884 A1 | 7/2008 | Matsumoto et al. |
| 2008/0272853 A1 | 11/2008 | Heinze et al. |
| 2008/0297278 A1 | 12/2008 | Handtmann et al. |
| 2009/0096549 A1 | 4/2009 | Thalhammer et al. |
| 2009/0096550 A1 | 4/2009 | Handtmann et al. |
| 2010/0277237 A1 | 11/2010 | Sinha et al. |
| 2011/0115334 A1 | 5/2011 | Konishi et al. |
| 2011/0121689 A1 | 5/2011 | Grannen et al. |
| 2011/0180391 A1 | 7/2011 | Larson, III et al. |
| 2011/0204995 A1 | 8/2011 | Jamneala et al. |
| 2011/0210787 A1 | 9/2011 | Lee et al. |
| 2012/0007696 A1 | 1/2012 | Pang et al. |
| 2012/0187799 A1 | 7/2012 | Nakahashi |
| 2012/0313725 A1 | 12/2012 | Ueda et al. |
| 2013/0033150 A1 | 2/2013 | Bardong et al. |
| 2013/0106248 A1 | 5/2013 | Burak et al. |
| 2013/0113576 A1 | 5/2013 | Inoue et al. |
| 2013/0193808 A1 | 8/2013 | Feng et al. |
| 2014/0085020 A1 | 3/2014 | Reinhardt et al. |
| 2014/0125203 A1 | 5/2014 | Choy et al. |
| 2014/0132117 A1 | 5/2014 | Larson, III |
| 2014/0145557 A1 | 5/2014 | Tanaka |
| 2014/0167565 A1 | 6/2014 | Iwamoto |
| 2015/0054387 A1 | 2/2015 | Li |
| 2015/0222246 A1 | 8/2015 | Nosaka |
| 2015/0280100 A1 | 10/2015 | Burak et al. |
| 2015/0369153 A1 | 12/2015 | Tsunooka et al. |
| 2016/0028364 A1 | 1/2016 | Takeuchi |
| 2016/0056789 A1 | 2/2016 | Otsubo et al. |
| 2016/0191012 A1 | 6/2016 | Khlat et al. |
| 2016/0191014 A1 | 6/2016 | Khlat et al. |
| 2016/0191016 A1 | 6/2016 | Khlat et al. |
| 2016/0261235 A1 | 9/2016 | Ortiz |
| 2016/0268998 A1 | 9/2016 | Xu et al. |
| 2016/0308576 A1 | 10/2016 | Khlat et al. |
| 2016/0359468 A1 | 12/2016 | Taniguchi et al. |
| 2017/0093369 A1 | 3/2017 | Khlat et al. |
| 2017/0093370 A1 | 3/2017 | Khlat et al. |
| 2017/0141757 A1 | 5/2017 | Schmidhammer |
| 2017/0201233 A1 | 7/2017 | Khlat |
| 2017/0301992 A1 | 10/2017 | Khlat et al. |
| 2017/0310302 A1 | 10/2017 | Bauder et al. |
| 2017/0324159 A1 | 11/2017 | Khlat |
| 2017/0338795 A1 | 11/2017 | Nakagawa et al. |
| 2018/0013402 A1 | 1/2018 | Kirkpatrick et al. |
| 2018/0041191 A1 | 2/2018 | Park |
| 2018/0076793 A1 | 3/2018 | Khlat et al. |
| 2018/0076794 A1 | 3/2018 | Khlat et al. |
| 2018/0109236 A1 | 4/2018 | Konoma |
| 2018/0109237 A1 | 4/2018 | Wasilik et al. |
| 2018/0145658 A1 | 5/2018 | Saji |
| 2018/0219530 A1 | 8/2018 | Khlat et al. |
| 2018/0241418 A1 | 8/2018 | Takamine et al. |
| 2018/0358947 A1 | 12/2018 | Mateu et al. |
| 2019/0103851 A1 | 4/2019 | Yusuf |
| 2019/0140618 A1 | 5/2019 | Takamine |
| 2019/0181824 A1 | 6/2019 | Timme et al. |
| 2019/0181835 A1 | 6/2019 | Timme et al. |
| 2019/0199320 A1 | 6/2019 | Morita et al. |
| 2019/0207583 A1 | 7/2019 | Miura et al. |
| 2019/0222197 A1 | 9/2019 | Saji |
| 2019/0288664 A1 | 9/2019 | Saji |
| 2019/0305752 A1 | 10/2019 | Sadhu et al. |
| 2021/0028755 A1 | 1/2021 | Yusuf |
| 2021/0194459 A1 | 6/2021 | Alavi et al. |
| 2021/0211116 A1 | 7/2021 | Khlat |
| 2021/0218385 A1 | 7/2021 | Yusuf et al. |
| 2021/0218386 A1 | 7/2021 | Yusuf et al. |
| 2022/0069800 A1 | 3/2022 | Han et al. |

FOREIGN PATENT DOCUMENTS

| | | | |
|---|---|---|---|
| CN | 205666806 U | * 10/2016 | ............ H02H 9/045 |
| CN | 111917392 A | 11/2020 | |
| DE | 102015107569 A1 | 11/2015 | |
| FR | 3018969 A1 | 9/2015 | |
| JP | 2002251190 A | 9/2002 | |
| JP | 2008085989 A | 4/2008 | |
| JP | 2011176744 A | 9/2011 | |
| JP | 2012257050 A | 12/2012 | |
| JP | 2017045749 A | 3/2017 | |
| JP | 2017103654 A | 6/2017 | |
| JP | 2018093388 A | 6/2018 | |
| WO | 2009132011 A2 | 10/2009 | |
| WO | WO-2014061351 A1 | * 4/2014 | ................ H01P 1/20 |

OTHER PUBLICATIONS

Non-Final Office Action for U.S. Appl. No. 17/088,872, mailed Aug. 29, 2022, 8 pages.
Notice of Allowance for U.S. Appl. No. 17/152,110, mailed Sep. 21, 2022, 7 pages.
Non-Final Office Action for U.S. Appl. No. 14/757,587, mailed Sep. 13, 2016, 12 pages.
Notice of Allowance for U.S. Appl. No. 14/757,587, mailed Mar. 9, 2017, 8 pages.
Non-Final Office Action for U.S. Appl. No. 15/004,084, mailed Jun. 12, 2017, 9 pages.
Non-Final Office Action for U.S. Appl. No. 14/757,651, mailed Jun. 9, 2017, 11 pages.
Non-Final Office Action for U.S. Appl. No. 15/275,957, mailed Jun. 14, 2017, 9 pages.
Ex Parte Quayle Action for U.S. Appl. No. 15/347,452, mailed Jun. 15, 2017, 7 pages.

(56) References Cited

OTHER PUBLICATIONS

Final Office Action for U.S. Appl. No. 15/275,957, mailed Jan. 2, 2018, 7 pages.
Author Unknown, "Saw Filters—SAW Resonators: Surface Acoustic Wave SAW Components," Product Specification, 2010, Token Electronics Industry Co., Ltd., 37 pages.
Fattinger, Gernot et al., "Miniaturization of BAW Devices and the Impact of Wafer Level Packaging Technology," Joint UFFC, EFTF and PFM Symposium, Jul. 21-25, 2013, Prague, Czech Republic, IEEE, pp. 228-231.
Kwa, Tom, "Wafer-Level Packaged Accelerometer With Solderable SMT Terminals," IEEE Sensors, Oct. 22-25, 2006, Daegu, South Korea, IEEE, pp. 1361-1364.
Lakin, K. M., "Coupled Resonator Filters," 2002 IEEE Ultrasonics Symposium, Oct. 8-11, 2002, Munich, Germany, 8 pages.
López, Edén Corrales, "Analysis and Design of Bulk Acoustic Wave Filters Based on Acoustically Coupled Resonators," PhD Thesis, Department of Telecommunications and Systems Engineering, Autonomous University of Barcelona, May 2011, 202 pages.
Potter, Bob R. et al., "Embedded Inductors Incorporated in the Design of SAW Module SMT Packaging," Proceedings of the 2002 Ultrasonics Symposium, Oct. 8-11, 2002, IEEE, pp. 397-400.
Schneider, Robert, "High-Q AlN Contour Mode Resonators with Unattached, Voltage-Actuated Electrodes," Thesis, Technical Report No. UCB/EECS-2015-247, Dec. 17, 2015, Electrical Engineering and Computer Sciences, University of California at Berkeley, http://www.eecs.berkeley.edu/Pubs/TechRpts/2015/EECS-2015-247.html, Robert Anthony Schneider, 222 pages.
Shirakawa, A. A., et al., "Bulk Acoustic Wave-Coupled Resonator Filters: Concept, Design, and Application," International Journal of RF and Microwave Computer-Aided Engineering, vol. 21, No. 5, Sep. 2011, 9 pages.
Corrales, Eden, et al., "Design of Three-Pole Bulk Acoustic Wave Coupled Resonator Filters," 38th European Microwave Conference, Oct. 2008, Amsterdam, Netherlands, EuMA, pp. 357-360.
De Paco, Pedro, et al., "Equivalent Circuit Modeling of Coupled Resonator Filters," Transactions on Ultrasonics, Ferroelectrics, and Frequency Control, vol. 55, Issue 9, Sep. 2008, IEEE, pp. 2030-2037.
Lakin, K. M., "Bulk Acoustic Wave Coupled Resonator Filters," International Frequency Control Symposium, 2002, EEE, pp. 8-14.
Shirakawa, A. A., et al., "Bulk Acoustic Wave Coupled Resonator Filters Synthesis Methodology," European Microwave Conference, Oct. 4-6, 2005, Paris, France, IEEE, 4 pages.
Tosic, Dejan, et al., "Symbolic analysis of immitance inverters," 14th Telecommunications Forum, Nov. 21-23, 2006, Belgrade, Serbia, pp. 584-487.
Non-Final Office Action for U.S. Appl. No. 14/757,651, mailed May 8, 2018, 8 pages.
Notice of Allowance for U.S. Appl. No. 15/347,428, mailed Jul. 12, 2018, 9 pages.
Notice of Allowance for U.S. Appl. No. 15/490,381, mailed May 23, 2018, 8 pages.
Final Office Action for U.S. Appl. No. 14/757,651, mailed Sep. 19, 2018, 7 pages.
Non-Final Office Action for U.S. Appl. No. 15/701,759, mailed Oct. 4, 2018, 10 pages.
Notice of Allowance for U.S. Appl. No. 15/727,117, mailed Mar. 13, 2019, 9 pages.
Non-Final Office Action for U.S. Appl. No. 15/586,374, mailed Feb. 26, 2019, 16 pages.
Notice of Allowance for U.S. Appl. No. 15/720,706, mailed Mar. 15, 2019, 9 pages.
Non-Final Office Action for U.S. Appl. No. 15/697,658, mailed May 1, 2019, 13 pages.
Larson, John, et al., "Characterization of Reversed c-axis AlN Thin Films," International Ultrasonics Symposium Proceedings, 2010, IEEE, pp. 1054-1059.
Notice of Allowance for U.S. Appl. No. 15/586,374, mailed Oct. 4, 2019, 7 pages.
Notice of Allowance for U.S. Appl. No. 15/644,922, mailed Oct. 21, 2019, 10 pages.
Final Office Action for U.S. Appl. No. 15/697,658, mailed Oct. 22, 2019, 9 pages.
Non-Final Office Action for U.S. Appl. No. 15/883,933, mailed Oct. 25, 2019, 19 pages.
Non-Final Office Action for U.S. Appl. No. 16/003,417, mailed Apr. 3, 2020, 9 pages.
Capilla, Jose et al., "High-Acoustic-Impedence Tantalum Oxide Layers for Insulating Acoustic Reflectors," IEEE Transactions on Ultrasonics, Ferroelectrics, and Frequency Control, vol. 59, No. 3, Mar. 2012, IEEE, pp. 366-372.
Fattinger, Gernot et al., "Single-to-balanced Filters for Mobile Phones using Coupled Resonator BAW Technology," 2004 IEEE International Ultrasonics, Ferroelectrics, and Frequency Control Joint 50th Anniversary Conference, Aug. 23-27, 2004, IEEE, pp. 416-419.
Lakin, K. M. et al., "High Performance Stacked Crystal Filters for GPS and Wide Bandwidth Applications," 2001 IEEE Ultrasonics Symposium, Oct. 7-10, 2001, IEEE, pp. 833-838.
Roy, Ambarish et al., "Spurious Modes Suppression in Stacked Crystal Filter," 2010 IEEE Long Island Systems, Applications and Technology Conference, May 7, 2010, 6 pages.
Non-Final Office Action for U.S. Appl. No. 16/290,175, mailed Apr. 14, 2020, 29 pages.
Ibrahim, A. et al., "Compact Size Microstrip Coupled Resonator Band Pass Filter Loaded with Lumped Capacitors," 2013 Second International Japan-Egypt Conference on Electronics, Communications and Computers (JEC-ECC), Dec. 17-19, 2013, Egypt, IEEE, 4 pages.
Tsai, H. et al., "Tunable Filter by FBAR Using Coupling Capacitors," Proceedings of the 2018 Asia-Pacific Microwave Conference (APMC), Nov. 6-9, 2018, Kyoto, Japan, IEICE, pp. 609-611.
Zhu, L et al., "Adjustable Bandwidth Filter Design Based on Interdigital Capacitors," IEEE Microwave and Wireless Components Letters, vol. 18, No. 1, Jan. 2008, IEEE, pp. 16-18.
Non-Final Office Action for U.S. Appl. No. 16/283,044, mailed Nov. 12, 2020, 9 pages.
Notice of Allowance for U.S. Appl. No. 15/697,658, mailed Nov. 17, 2020, 7 pages.
Final Office Action for U.S. Appl. No. 15/883,933, mailed Oct. 23, 2020, 15 pages.
Advisory Action for U.S. Appl. No. 15/883,933, mailed Dec. 31, 2020, 3 pages.
Notice of Allowance and Examiner-Initiated Interview Summary for U.S. Appl. No. 16/003,417, mailed Aug. 5, 2020, 9 pages.
Final Office Action for U.S. Appl. No. 16/290,175, mailed Sep. 17, 2020, 13 pages.
Non-Final Office Action for U.S. Appl. No. 16/290,175, mailed Jan. 6, 2021, 14 pages.
Aigner, R. et al., "3G—4G—5G: How BAW Filter Technology Enables a Connected World," 20th International Conference on Solid-State Sensors, Actuators and Microsystems & Eurosensors XXXIII (Transducers & Eurosensors XXXIII), Jun. 23-27, 2019, Berlin, Germany, IEEE, pp. 523-526.
Kreuzer, S. et al., "Full band 41 filter with high Wi-Fi rejection—design and manufacturing challenges," IEEE International Ultrasonics Symposium (IUS), Oct. 21-24, 2015, Taipei, Taiwan, IEEE, 4 pages.
Volatier, A. et al., "Technology enhancements for high performance BAW duplexer," IEEE International Ultrasonics Symposium (IUS), Jul. 21-25, 2013, Prague, Czech Republic, IEEE, pp. 761-764.
Non-Final Office Action for U.S. Appl. No. 16/740,667, mailed Mar. 4, 2021, 10 pages.
Non-Final Office Action for U.S. Appl. No. 16/776,738, mailed Mar. 4, 2021, 7 pages.
Non-Final Office Action for U.S. Appl. No. 16/806,166, mailed Mar. 18, 2021, 6 pages.
Larson, John, et al., "Characterization of Reversed c-axis AlN Thin Films," IEEE International Ultrasonics Symposium, San Diego, California, 2010, pp. 1054-1059.
Non-Final Office Action for U.S. Appl. No. 16/358,823, mailed Apr. 5, 2021, 12 pages.

(56) References Cited

OTHER PUBLICATIONS

Non-Final Office Action for U.S. Appl. No. 15/883,933, mailed Mar. 29, 2021, 11 pages.
Zverev, A., "Figure 8.25," Hanbook of Filter Synthesis, 1967, John Wiley & Sons, 4 pages.
Zverev, A., "The Synthesis of Intermediate Bandpass Filters," Hanbook of Filter Synthesis, 1967, John Wiley & Sons, pp. 483-488.
Notice of Allowance for U.S. Appl. No. 16/290,175, mailed Jun. 14, 2021, 7 pages.
Corrected Notice of Allowability for U.S. Appl. No. 16/290,175, mailed Jun. 23, 2021, 4 pages.
Notice of Allowance for U.S. Appl. No. 16/740,667, mailed Jun. 11, 2021, 7 pages.
Notice of Allowance for U.S. Appl. No. 16/776,738, mailed Jun. 11, 2021, 7 pages.
Notice of Allowance for U.S. Appl. No. 16/806,166, mailed Jun. 18, 2021, 7 pages.
Moreira, M. et al., "Aluminum scandium nitride thin-film bulk acoustic resonators for wide band applications," Vacuum, vol. 86, Issue 1, Jul. 2011, Elsevier Ltd., 4 pages.
Notice of Allowance and Examiner-Initiated Interview Summary for U.S. Appl. No. 16/722,125, mailed Jun. 24, 2022, 10 pages.
Non-Final Office Action for U.S. Appl. No. 17/152,110, mailed May 27, 2022, 6 pages.
Extended European Search Report for European Patent Application No. 22150239.6, mailed Jun. 9, 2022, 10 pages.
Decision to Grant for Japanese Patent Application No. 2018181230, mailed Apr. 13, 2023, 5 pages.
Reason for Rejection for Japanese Patent Application No. 2019058733, mailed Mar. 2, 2023, 14 pages.
Notice of Preliminary Rejection for Korean Patent Application No. 1020180116185, mailed Dec. 23, 2023, 10 pages.
Notice of Allowance for U.S. Appl. No. 17/088,872, mailed Dec. 14, 2022, 7 pages.
Notice of Preliminary Rejection for Korean Patent Application No. 1020190035987, mailed Mar. 26, 2024, 9 pages.
Akoustis, "The Latest In WiFi 7 Filter Technology: A10655 And A10665," Akoustis Blog, Sep. 29, 2022, available online: [URL: https://akoustis.com/the-latest-in-wifi-7-filter-technology-a10655-and-a10665/? utm_source=everythingRF], 5 pages.
Hetting, C., "Akoustis: 'XBAW™M' filters critical for full utilization of 5 GHz & 6 GHz Wi-Fi bands," Wi-Fi Now Golbal, May 6, 2022, available online: [URL: https://wifinowglobal.com/news-and-blog/akoustis-xbaw-filters-critical-for-full-utilization-of-5-ghz-6-ghz-wi-fi-bands/?mc_cid=af353ad165&mc_eid=2c2%E2%80%A6], 4 pages.
Iborra, E. et al., "Piezoelectric and Electroacoustic Properties of V-Doped and Ta-Doped AlN Thin Films," 2013 Joint European Frequency and Time Forum & International Frequency Control Symposium (EFTF/IFC), Jul. 21-25, 2013, Prague, Czech Republic, IEEE, pp. 262-265.
Decision on Registration for Korean Patent Application No. 1020180116185, mailed Jul. 12, 2024, 2 pages.
First Office Action for Chinese Patent Application No. 201910229019.6, mailed Aug. 1, 2024, 13 pages.

\* cited by examiner

REVERSED SEMILATTICE FILTER

BACKGROUND

I. Field of the Disclosure

The technology of the disclosure relates generally to filters and, more particularly, to reversed semilattice filters and, more particularly, to reversed semilattice filters with improved rejection characteristics.

II. BACKGROUND

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. The advent of the Fifth Generation-new radio (5G-NR) cellular standards have imposed more stringent standards on signal processing. Not only are the standards more stringent, but they are also relevant at frequencies substantially higher than those contemplated by previous cellular standards. Accordingly, there remains room for improvement in the processing of high frequency signals including processing by filters.

SUMMARY

Aspects disclosed in the detailed description include reversed semilattice filters with improved common mode rejection characteristics. In particular, a filter may include two interior nodes coupled with an impedance that treats unwanted signals as common mode signals and provides rejection for common mode signals while passing differential signals of interest. The impedance is modified to have a resonant circuit that improves signal rejection in the stop band by lowering the effective impedance at those frequencies while leaving the pass band unaffected. The improved performance in the stop band improves overall performance and compliance with newer cellular standards.

In this regard in one aspect, a filter is disclosed. The filter comprises a first impedance path between an input node and an output node. The first impedance path comprises a first impedance and a second impedance serially connected to one another and defining a first node therebetween. The filter also comprises a second impedance path between the input node and the output node. The second impedance path is electrically parallel to the first impedance path. The second impedance path comprises a third impedance and a fourth impedance serially connected to one another and define a second node therebetween. The first impedance path and the second impedance path comprise a reversed semilattice filter. The filter also comprises a first inductor coupled the first node. The filter also comprises a second inductor serially coupling the first inductor to the second node. The filter also comprises a resonant circuit associated with the first inductor and the second inductor. The resonant circuit is configured to lower a common mode impedance for the filter at a predetermined notch frequency.

In another aspect, a filter is disclosed. The filter comprises a transformer comprising a first coil having a first center tap and a second coil having a second center tap. The filter also comprises a first impedance path. The first impedance path comprises a first impedance coupling an input node to the first coil. The first impedance path also comprises a second impedance coupling the second coil to an output node. The filter also comprises a second impedance path. The second impedance path comprises a third impedance coupling the input node to the first coil. The third impedance is electrically parallel to the first impedance. The second impedance path also comprises a fourth impedance coupling the second coil to the output node. The fourth impedance is electrically parallel to the second impedance. Collectively, the first impedance path, the second impedance path, and the transformer comprise a reversed semilattice filter. The transformer couples the first impedance to the second impedance. The transformer couples the third impedance to the fourth impedance. The filter also comprises a resonant circuit associated with the first center tap. The resonant circuit is configured to lower a common mode impedance for the filter at a predetermined notch frequency.

In another aspect, a filter is disclosed. The filter comprises a first impedance path between an input node and an output node. The first impedance path comprises a first impedance and a second impedance serially connected to one another and defining a first node therebetween. The filter also comprises a second impedance path between the input node and the output node. The second impedance path is electrically parallel to the first impedance path. The second impedance path comprises a third impedance and a fourth impedance serially connected to one another and defining a second node therebetween. The first impedance path and the second impedance path comprise a reversed semilattice filter. The filter also comprises a first inductor coupled the first node. The filter also comprises a second inductor serially coupling the first inductor to the second node and defining a third node between the first inductor and the second inductor. The filter also comprises a capacitor coupling the third node to ground to lower a common mode impedance for the filter at a predetermined notch frequency.

DETAILED DESCRIPTION

Figure 1:
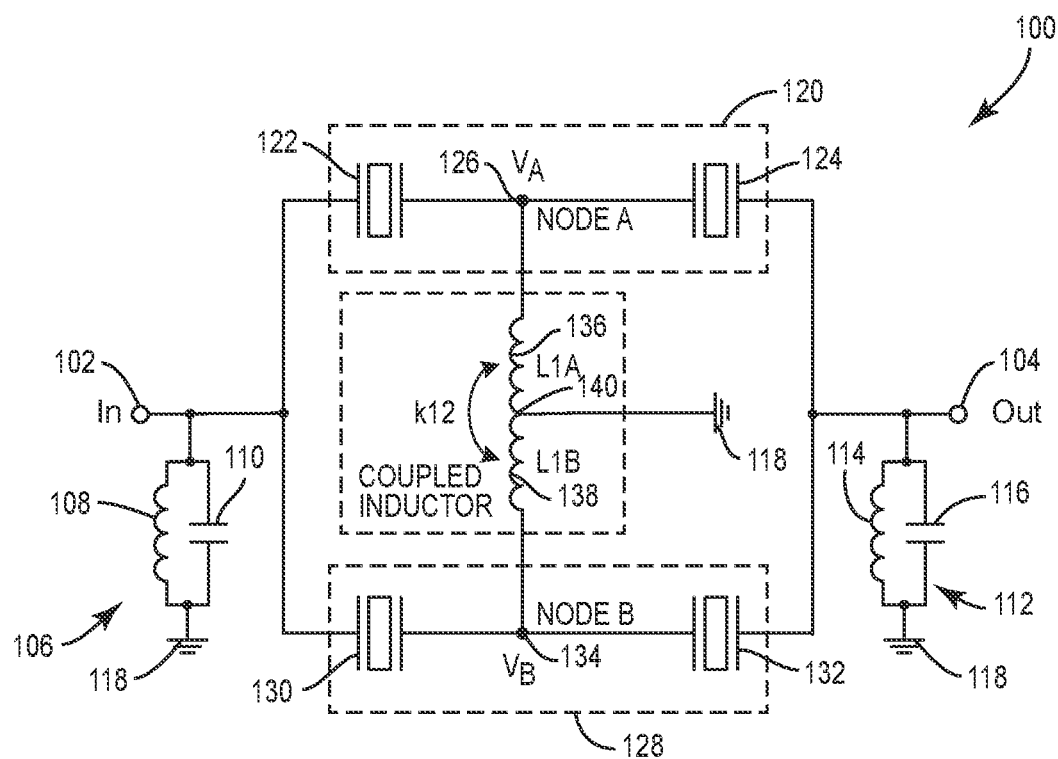
FIG. 1 is a circuit diagram of a conventional reversed semilattice filter.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include reversed semilattice filters with improved common mode rejection characteristics. In particular, a filter may include two interior nodes coupled with an impedance that treats unwanted signals as common mode signals and provides rejection for common mode signals while passing differential signals of interest. The impedance is modified to have a resonant circuit that improves signal rejection in the stop band by lowering the effective impedance at those frequencies while leaving the pass band unaffected. The improved performance in the stop band improves overall performance and compliance with newer cellular standards.

Before addressing exemplary aspects of the present disclosure, a brief review of a conventional reversed semilattice filter is provided with reference to FIG. 1. As a note of nomenclature, a semilattice filter may also be referred to in the literature as a half lattice or transversal filter. A discussion of exemplary aspects of the present disclosure begins below with reference to FIG. 2A.

In this regard, FIG. 1 is circuit diagram of a conventional reversed semilattice filter 100. The filter 100 includes an input node 102 and an output node 104. The filter 100 further includes an input LC circuit 106 formed from a first inductor 108 and a first capacitor 110. The filter further includes an output LC circuit 112 formed from a second inductor 114 and a second capacitor 116. The input LC circuit 106 and the output LC circuit 112 couple to a ground 118. The filter 100 further includes a first impedance path 120 between the input node 102 and the output node 104. The first impedance path 120 includes a first impedance 122 and a second impedance 124 serially connected to one another and defining a first node 126 therebetween. As illustrated, the first impedance 122 and the second impedance 124 may be bulk acoustic wave (BAW) resonators.

The filter 100 further includes a second impedance path 128 between the input node 102 and the output node 104. The second impedance path 128 is electrically parallel to the first impedance path 120. The second impedance path 128 includes a third impedance 130 and a fourth impedance 132 serially connected to one another and defining a second node 134 therebetween. As illustrated, the third impedance 130 and the fourth impedance 132 may be BAW resonators.

The filter 100 further includes an inductor 136 coupled to the first node 126. The inductor 136 is serially coupled to an inductor 138. The inductor 138 couples to the second node 134. A third node 140 is positioned between the inductor 136 and the inductor 138. The third node 140 may be coupled to ground 118. The inductor 136 and the inductor 138 are coupled to one another.

In the past, the impedances 122, 124, 130, 132 and the inductors 136, 138 are chosen such that the wanted in-band signals appear as a differential signal across the nodes 126, 134. In contrast, the unwanted, out-of-band signals, appear as common mode signals. The common mode signals are attenuated by a low common mode impedance between the nodes 126, and 134. Conventional approaches rely on tight coupling between the inductors 136, 138. As mobile communication devices move into the higher frequencies of the Fifth Generation-New Radio (5G-NR) cellular standards, the range of frequencies for which rejection is desired has increased. Likewise, the sizing requirements for modern circuitry makes it increasingly difficult to achieve a desired tight coupling. Accordingly, there is room for improvement of such filters.

Exemplary aspects of the present disclosure associate a resonant circuit with the inductors to lower a common mode impedance for the filter at a predetermined notch frequency.

The details of the resonant circuit may be varied to meet design criteria in terms of frequencies rejected, cost, space, and the like.

Figure 2A:
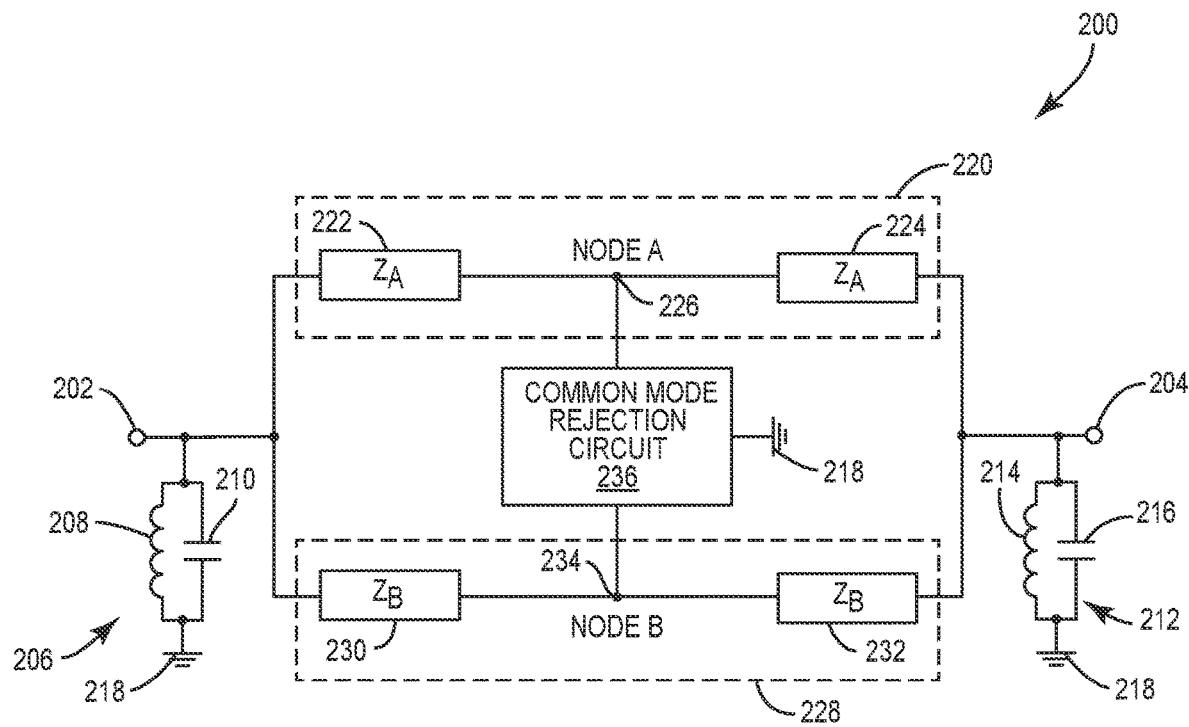
FIG. 2A is a block diagram of a reversed semilattice filter with a common mode rejection circuit according to an exemplary aspect of the present disclosure.

In this regard, FIG. 2A illustrates a generic filter 200 according to an aspect of the present disclosure. The filter 200 includes an input node 202 and an output node 204. The filter 200 further includes an input LC circuit 206 formed from a first inductor 208 and a first capacitor 210. The filter 200 further includes an output LC circuit 212 formed from a second inductor 214 and a second capacitor 216. The input LC circuit 206 and the output LC circuit 212 couple to a ground 218. The filter 200 further includes a first impedance path 220 between the input node 202 and the output node 204. The first impedance path 220 includes a first impedance ($Z_A$) 222 and a second impedance ($Z_A$) 224 serially connected to one another and defining a first node 226 therebetween. As illustrated, the first impedance 222 and the second impedance 224 may be identical.

The filter 200 further includes a second impedance path 228 between the input node 202 and the output node 204. The second impedance path 228 is electrically parallel to the first impedance path 220. The second impedance path 228 includes a third impedance ($Z_B$) 230 and a fourth impedance ($Z_B$) 232 serially connected to one another and defining a second node 234 therebetween.

Figure 2B:
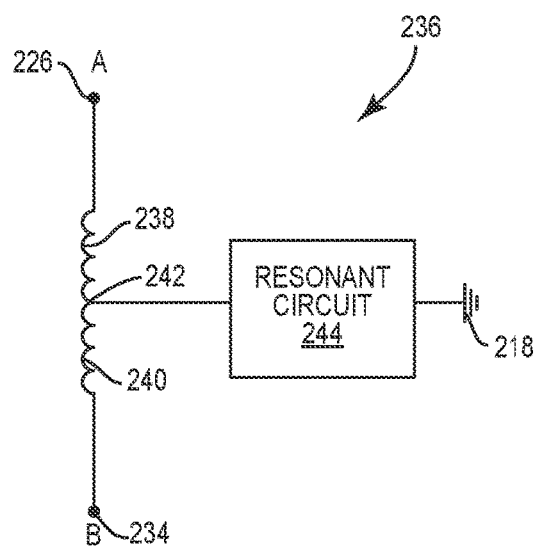
FIG. 2B is a circuit diagram providing additional details of the common mode rejection circuit of FIG. 2A.

The filter 200 further includes a common mode rejection circuit 236 that couples the nodes 226 and 234 to ground 218. Additional details of the common mode rejection circuit 236 are provided in FIG. 2B, where a first inductor 238 is coupled to the first node 226 and a second inductor 240 is coupled to the second node 234. The first inductor 238 is serially connected to the second inductor 240 with a third node 242 therebetween. A resonant circuit 244 is associated with the first inductor 238 and the second inductor 240, and particularly coupled to the third node 242. The resonant circuit 244 is configured to lower a common mode impedance for the filter 200 at a predetermined notch frequency.

Figure 3:
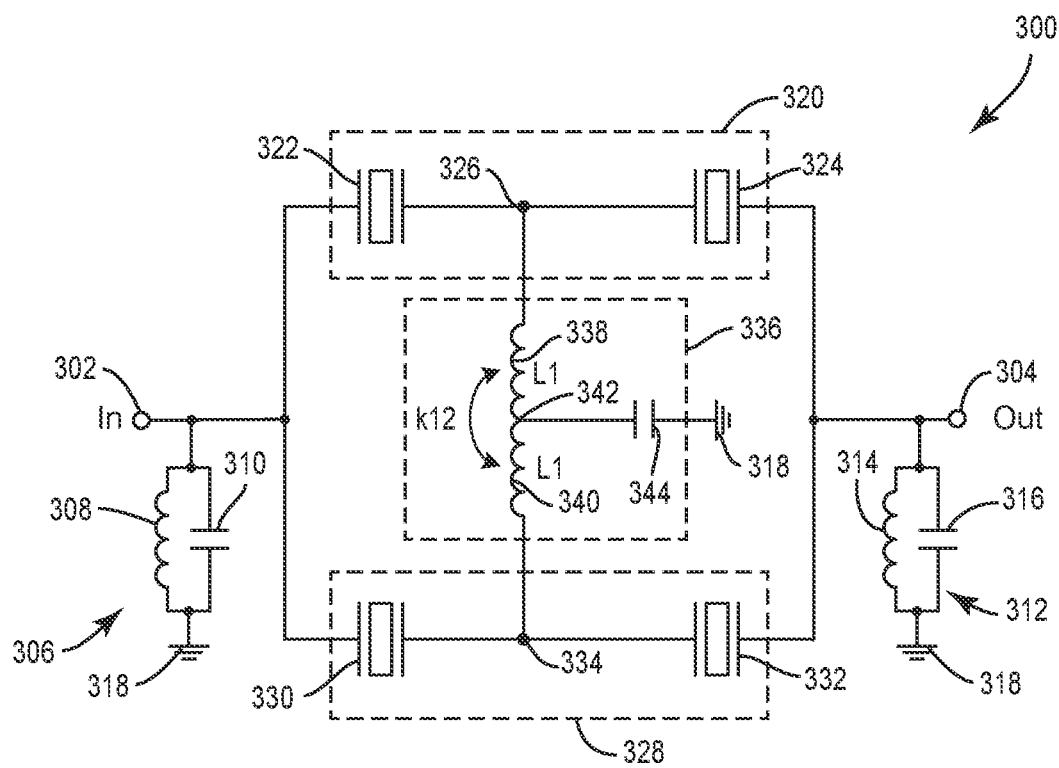
FIG. 3 is a circuit diagram of an exemplary aspect of a reversed semilattice filter with a simple resonant circuit used to form the common mode rejection circuit of FIG. 2A

FIGS. 3-7 provide exemplary aspects of the resonant circuit 244 as well as variations in the impedances 222, 224, 230, 232. In this regard, FIG. 3 illustrates a filter 300 according to an aspect of the present disclosure. The filter 300 includes an input node 302 and an output node 304. The filter 300 further includes an input LC circuit 306 formed from an inductor 308 and a capacitor 310. The filter 300 further includes an output LC circuit 312 formed from an inductor 314 and a capacitor 316. The input LC circuit 306 and the output LC circuit 312 couple to a ground 318. The filter 300 further includes a first impedance path 320 between the input node 302 and the output node 304. The first impedance path 320 includes a first impedance 322 and a second impedance 324 serially connected to one another and defining a first node 326 therebetween. As illustrated, the first impedance 322 and the second impedance 324 may be identical BAW resonators.

The filter 300 further includes a second impedance path 328 between the input node 302 and the output node 304. The second impedance path 328 is electrically parallel to the first impedance path 320. The second impedance path 328 includes a third impedance 330 and a fourth impedance 332 serially connected to one another and defining a second node 334 therebetween. As illustrated, the third impedance 330 and the fourth impedance 332 may be identical BAW resonators.

The filter 200 further includes a common mode rejection circuit 336 that couples the nodes 326 and 334 to ground 318. The common mode rejection circuit 336 may include a first inductor 338 and a second inductor 340 serially coupling the first node 326 to the second node 334 and defining a third node 342 therebetween. A capacitor 344 couples the third node 342 to ground 318. The capacitor 344 may be chosen to determine a notch frequency. The inductors 338, 340 may be coupled to one another.

Figure 4:
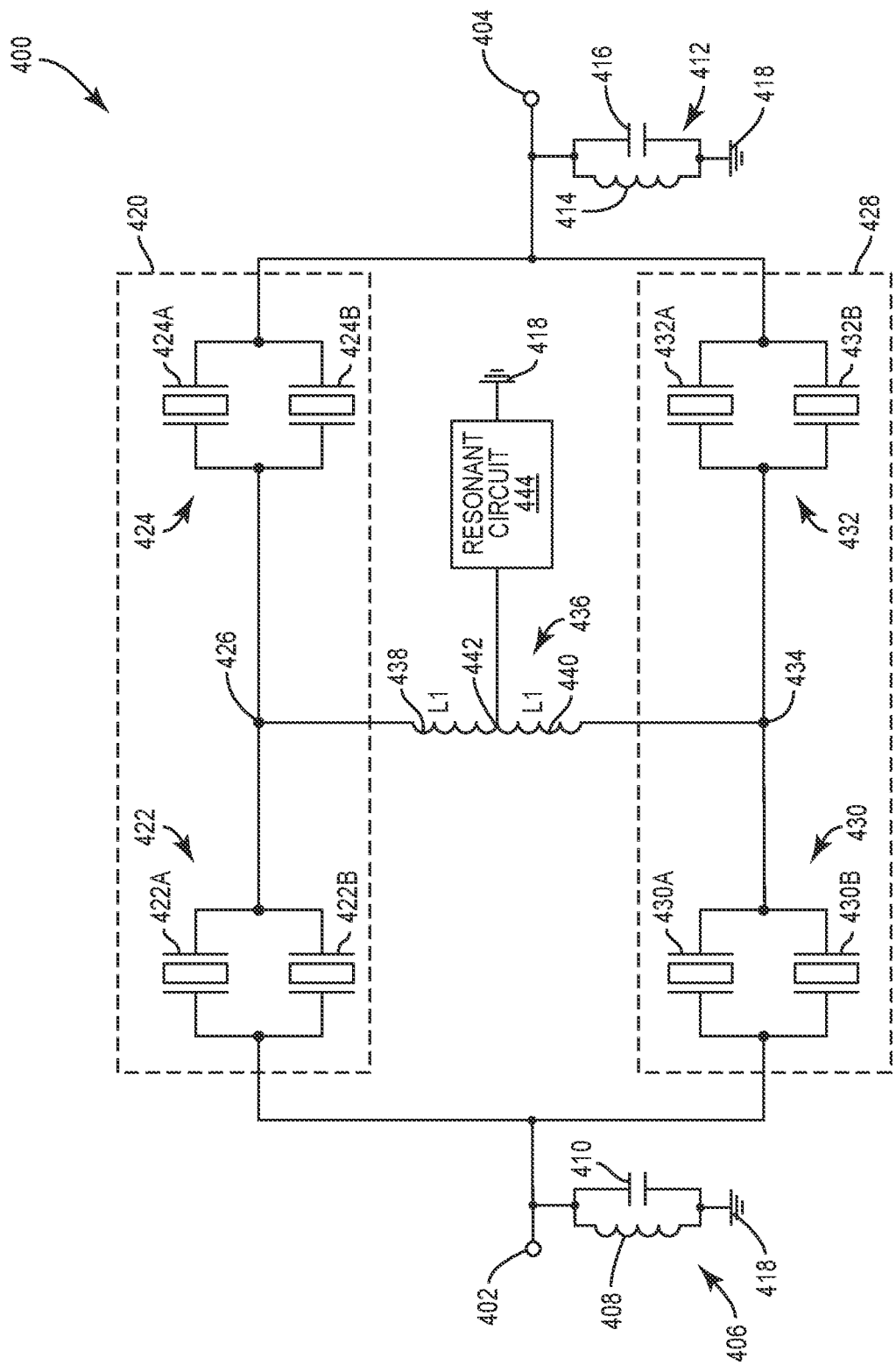
FIG. 4 is a circuit diagram with a generic common mode impedance and multiple resonators used as impedance in the reversed semilattice filter to provide multiple resonances.

Another exemplary aspect of the present disclosure is provided in FIG. 4, which illustrates a filter 400, which expands the impedances in the first and second impedance paths. In this regard, the filter 400 includes an input node 402 and an output node 404. The filter 400 further includes an input LC circuit 406 formed from an inductor 408 and a capacitor 410. The filter further includes an output LC circuit 412 formed from an inductor 414 and a capacitor 416. The input LC circuit 406 and the output LC circuit 412 couple to a ground 418. The filter 400 further includes a first impedance path 420 between the input node 402 and the output node 404. The first impedance path 420 includes a first impedance 422 formed from electrically parallel BAW resonators 422A, 422B and a second impedance 424 formed from electrically parallel BAW resonators 424A, 424B. The impedances 422, 424 are serially connected to one another and defining a first node 426 therebetween. Note that in some cases, such as the filter 400, the impedances may be formed from distinct impedance elements and form an impedance network (e.g., BAW resonators 422A, 422B form an impedance network within the impedance 422). Accordingly, the use of "impedance" herein includes such impedance networks.

The filter 400 further includes a second impedance path 428 between the input node 402 and the output node 404. The second impedance path 428 is electrically parallel to the first impedance path 420. The second impedance path 428 includes a third impedance 430 formed from electrically parallel BAW resonators 430A, 430B and a fourth impedance 432 formed from electrically parallel BAW resonators 432A, 432B. The impedances 430, 432 are serially connected to one another and defining a second node 434 therebetween.

The filter 400 further includes a common mode rejection circuit 436 that couples the nodes 426 and 434 to ground 418. The common mode rejection circuit 436 includes a first inductor 438 coupled to the first node 426 and a second inductor 440 coupled to the second node 434. The first inductor 438 is serially connected to the second inductor 440 with a third node 442 therebetween. A resonant circuit 444 is associated with the first inductor 438 and the second inductor 440, and particularly coupled to the third node 442. The resonant circuit 444 is configured to lower a common mode impedance for the filter 400 at a predetermined notch frequency.

Figure 5:
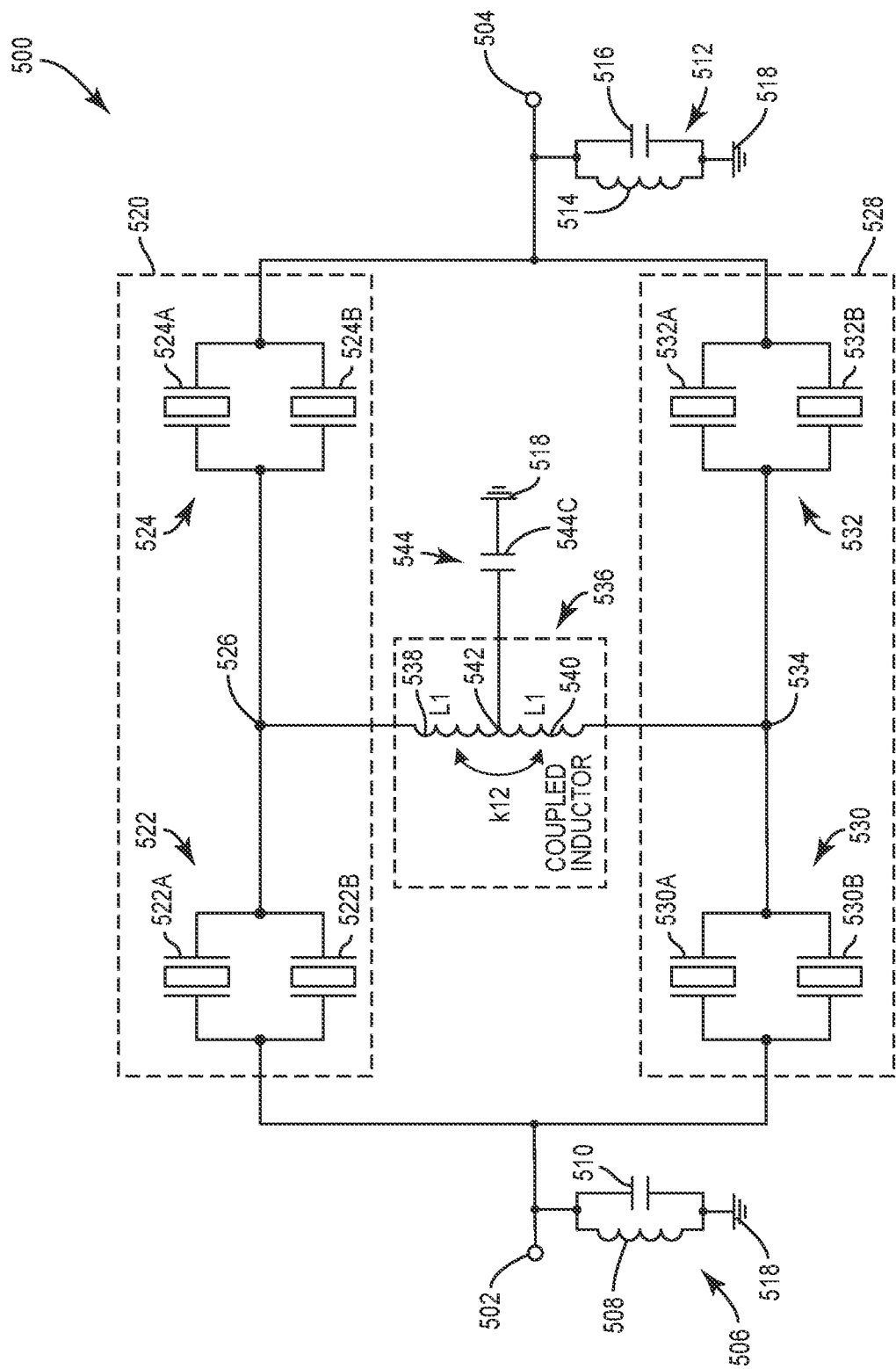
FIG. 5 is a circuit diagram of one exemplary aspect of the circuit of FIG. 4.
Figure 6:
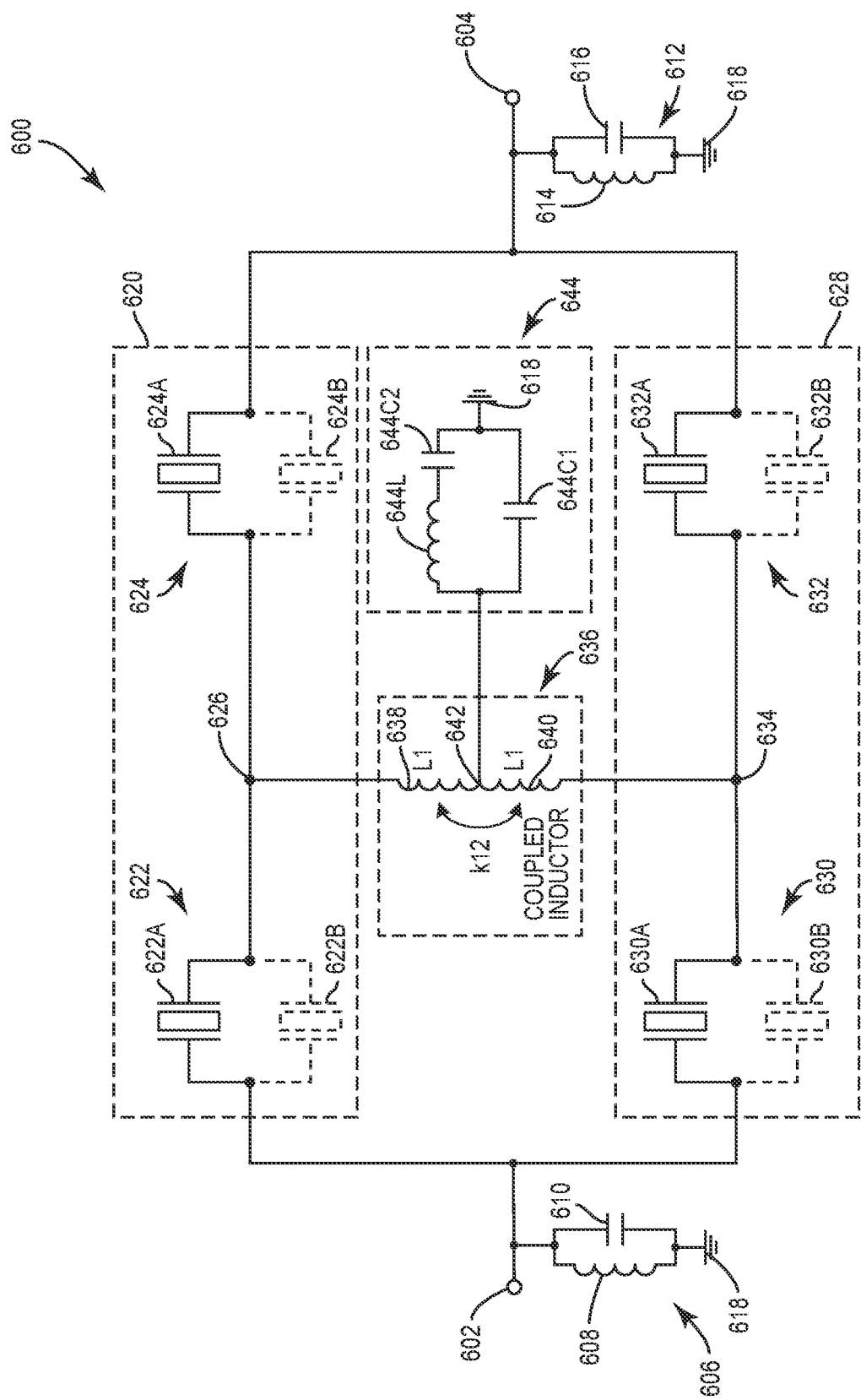
FIG. 6 is a circuit diagram of a second exemplary aspect of the circuit of FIG. 3 or 5.
Figure 7:
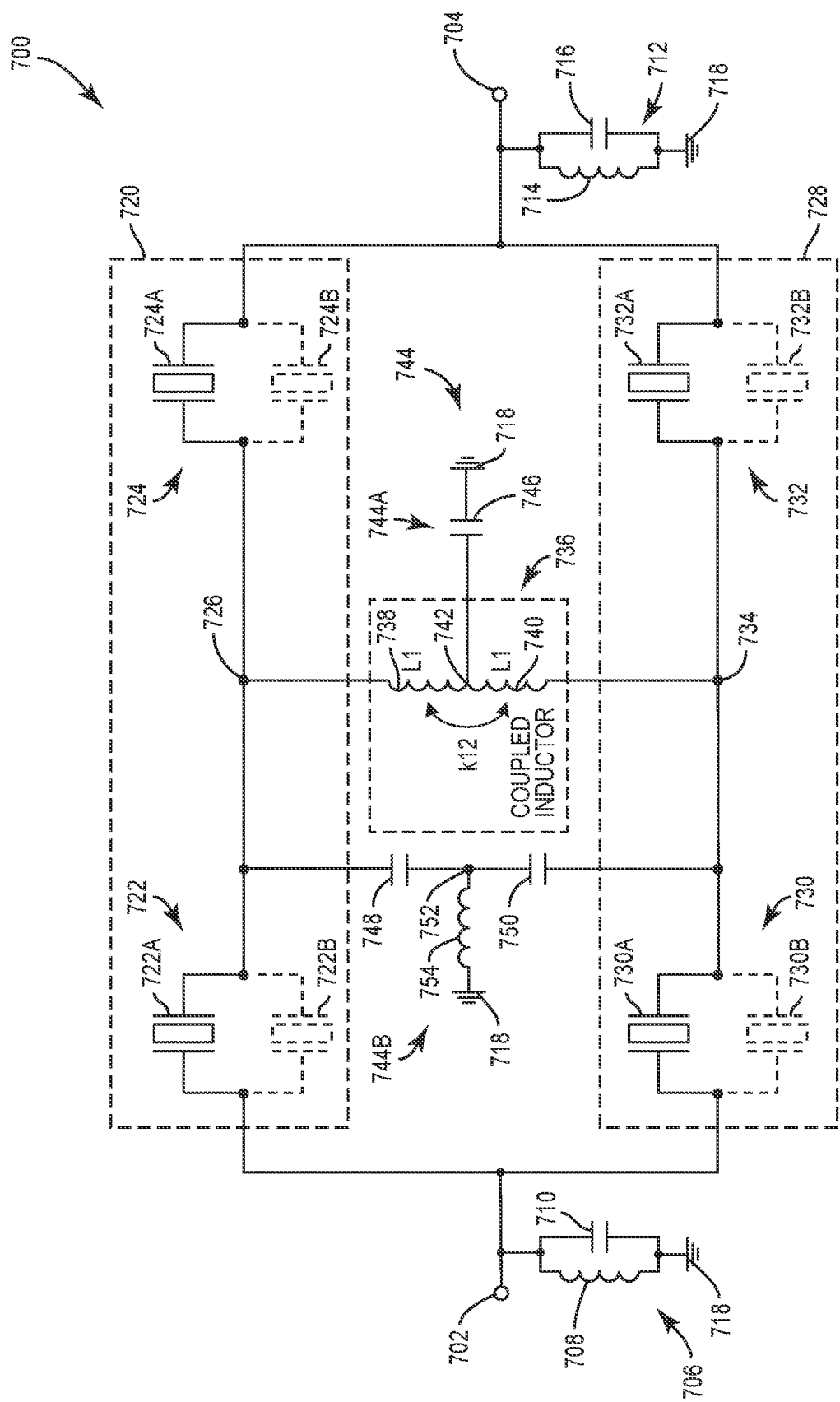
FIG. 7 is a circuit diagram of another exemplary aspect of the circuit of FIG. 3 or 5.

Combining the concepts of FIG. 3 and FIG. 4 results in a filter 500 illustrated in FIG. 5. In this regard, the filter 500 includes an input node 502 and an output node 504. The filter 500 further includes an input LC circuit 506 formed from an inductor 508 and a capacitor 510. The filter further includes an output LC circuit 512 formed from an inductor 514 and a capacitor 516. The input LC circuit 506 and the output LC circuit 512 couple to a ground 518. The filter 500 further includes a first impedance path 520 between the input node 502 and the output node 504. The first impedance path 520 includes a first impedance 522 formed from electrically parallel BAW resonators 522A, 522B and a second impedance 524 formed from electrically parallel BAW resonators 524A, 524B. The impedances 522, 524 are serially connected to one another and defining a first node 526 therebetween.

The filter 500 further includes a second impedance path 528 between the input node 502 and the output node 504. The second impedance path 528 is electrically parallel to the first impedance path 520. The second impedance path 528 includes a third impedance 530 formed from electrically parallel BAW resonators 530A, 530B and a fourth impedance 532 formed from electrically parallel BAW resonators 532A, 532B. The impedances 530, 532 are serially connected to one another and defining a second node 534 therebetween.

The filter 500 further includes a common mode rejection circuit 536 that couples the nodes 526 and 534 to ground 518. The common mode rejection circuit 536 includes a first inductor 538 coupled to the first node 526 and a second inductor 540 coupled to the second node 534. The first inductor 538 is serially connected to the second inductor 540 with a third node 542 therebetween. Optionally, the first inductor 538 may be inductively coupled to the second inductor 540. A resonant circuit 544, which may be a capacitor 544C, is associated with the first inductor 538 and the second inductor 540, and particularly coupled to the third node 542. The capacitor 544C may be chosen to lower a common mode impedance for the filter 500 at a predetermined notch frequency.

The notch frequency may be more specifically determined by a higher order common mode rejection circuit and more particularly by changing the resonant circuit to a higher order resonant circuit. In this regard, a filter 600, illustrated in FIG. 6, includes an input node 602 and an output node 604. The filter 600 further includes an input LC circuit 606 formed from an inductor 608 and a capacitor 610. The filter 600 further includes an output LC circuit 612 formed from an inductor 614 and a capacitor 616. The input LC circuit 606 and the output LC circuit 612 couple to a ground 618. The filter 600 further includes a first impedance path 620 between the input node 602 and the output node 604. The first impedance path 620 includes a first impedance 622. The first impedance 622 may be formed from a BAW resonator 622A, and optionally an electrically parallel BAW resonator 622B. The first impedance path 620 further includes a second impedance 624 formed from a BAW resonator 624A and optionally an electrically parallel BAW resonator 624B. The impedances 622, 624 are serially connected to one another and defining a first node 626 therebetween.

The filter 600 further includes a second impedance path 628 between the input node 602 and the output node 604. The second impedance path 628 is electrically parallel to the first impedance path 620. The second impedance path 528 includes a third impedance 630. The third impedance 630 may be formed from a BAW resonator 630A, and optionally an electrically parallel BAW resonator 630B. The second impedance path 628 further includes a fourth impedance 632 formed from a BAW resonator 632A and optionally an electrically parallel BAW resonator 632B. The impedances 630, 632 are serially connected to one another and defining a second node 634 therebetween.

The filter 600 further includes a common mode rejection circuit 636 that couples the nodes 626 and 634 to ground 618. The common mode rejection circuit 636 includes a first inductor 638 coupled to the first node 626 and a second inductor 640 coupled to the second node 634. The first inductor 638 is serially connected to the second inductor 640 with a third node 642 therebetween. Optionally, the first inductor 638 may be inductively coupled to the second inductor 640. A resonant circuit 644, which may be a capacitor 644C1 positioned in parallel to an inductor 644L and capacitor 644C2, is associated with the first inductor 638 and the second inductor 640, and particularly coupled to the third node 642. The capacitors 644C1, 644C2, and inductor 644L may be chosen to lower a common mode impedance for the filter 600 at a predetermined notch frequency.

Alternatively, the common mode rejection circuit may be bifurcated to provide additional rejection notches. In this regard, a filter 700, illustrated in FIG. 7, includes an input node 702 and an output node 704. The filter 700 further includes an input LC circuit 706 formed from an inductor 708 and a capacitor 710. The filter 700 further includes an output LC circuit 712 formed from an inductor 714 and a capacitor 716. The input LC circuit 706 and the output LC circuit 712 couple to a ground 718. The filter 700 further includes a first impedance path 720 between the input node 702 and the output node 704. The first impedance path 720 includes a first impedance 722. The first impedance 722 may be formed from a BAW resonator 722A, and optionally an electrically parallel BAW resonator 722B. The first impedance path 720 further includes a second impedance 724 formed from a BAW resonator 724A and optionally an electrically parallel BAW resonator 724B. The impedances 722, 724 are serially connected to one another and defining a first node 726 therebetween.

The filter 700 further includes a second impedance path 728 between the input node 702 and the output node 704. The second impedance path 728 is electrically parallel to the first impedance path 720. The second impedance path 728 includes a third impedance 730. The third impedance 730 may be formed from a BAW resonator 730A, and optionally an electrically parallel BAW resonator 730B. The second impedance path 728 further includes a fourth impedance 732 formed from a BAW resonator 732A and optionally an electrically parallel BAW resonator 732B. The impedances 730, 732 are serially connected to one another and defining a second node 734 therebetween.

The filter 700 further includes a common mode rejection circuit 736 that couples the nodes 726 and 734 to ground 718. The common mode rejection circuit 736 includes a first inductor 738 coupled to the first node 726 and a second inductor 740 coupled to the second node 734. The first inductor 738 is serially connected to the second inductor 740 with a third node 742 therebetween. Optionally, the first inductor 738 may be inductively coupled to the second inductor 740. As noted, a resonant circuit 744 may be bifurcated into two circuits 744A, 744B. The circuit 744A may be a capacitor 746, which couples the third node 742 to ground 718. The circuit 744B may couple the first node 726 to the second node 734 electrically in parallel to the inductors 738, 740. The circuit 744B may include a second capacitor 748 and a third capacitor 750 serially positioned between the nodes 726, 734 and defining an LC node 752 therebetween. The LC node 752 may be coupled to ground 718 through a third inductor 754 and thus form an LC circuit. The values of the capacitors 746, 748, 750 and the inductor 754 may be chosen to lower a common mode impedance for the filter 700 at a predetermined notch frequency.

At some point, the complexity of increasingly higher order resonant circuits may exceed the return, but it should be appreciated that if there are critical frequencies which must be suppressed or blocked, an appropriate resonant frequency circuit may be crafted and remain in the scope of the present disclosure.

Figure 8:
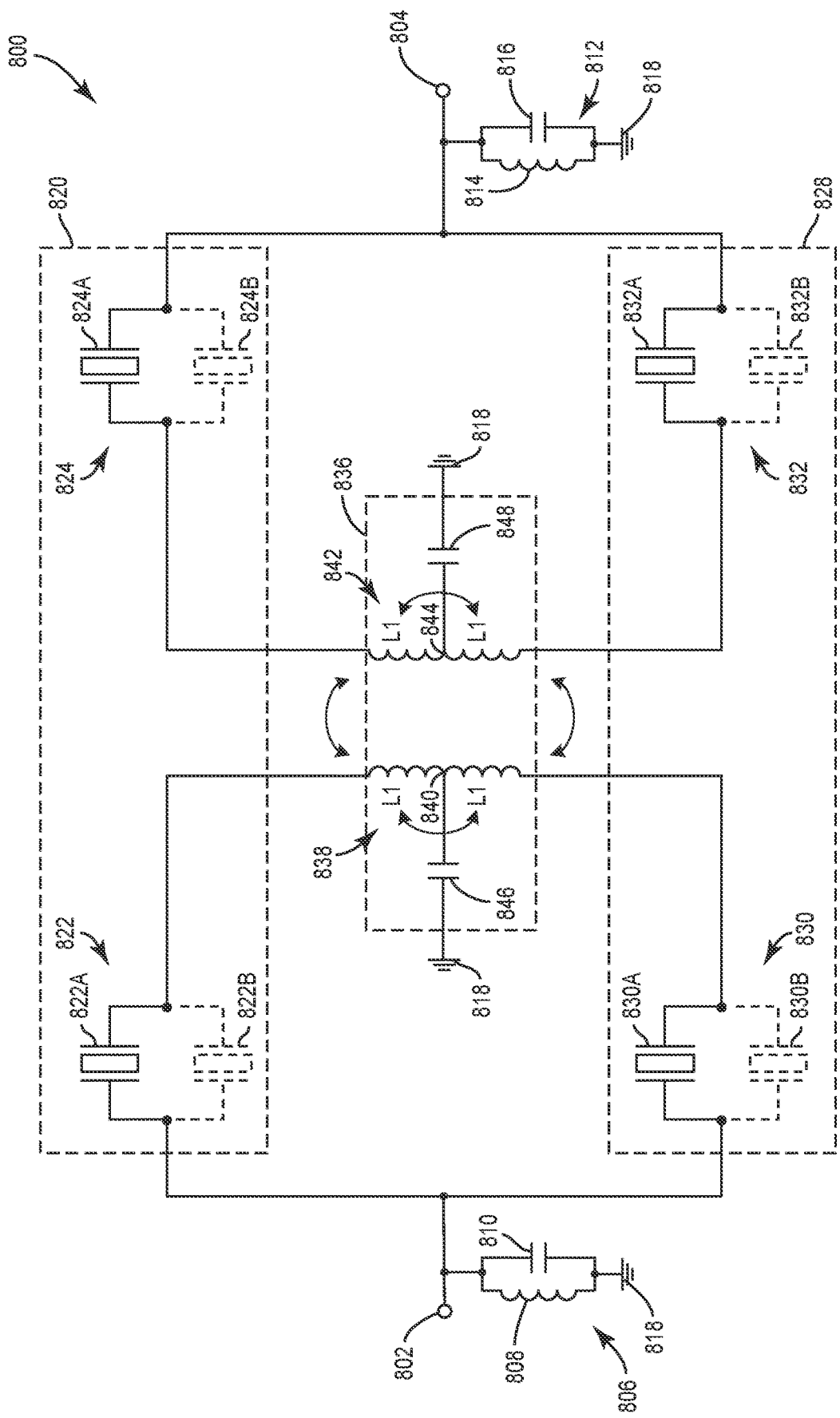
FIG. 8 is a circuit diagram of a reversed semilattice filter that implements a differential impedance with a transformer.
Figure 9:
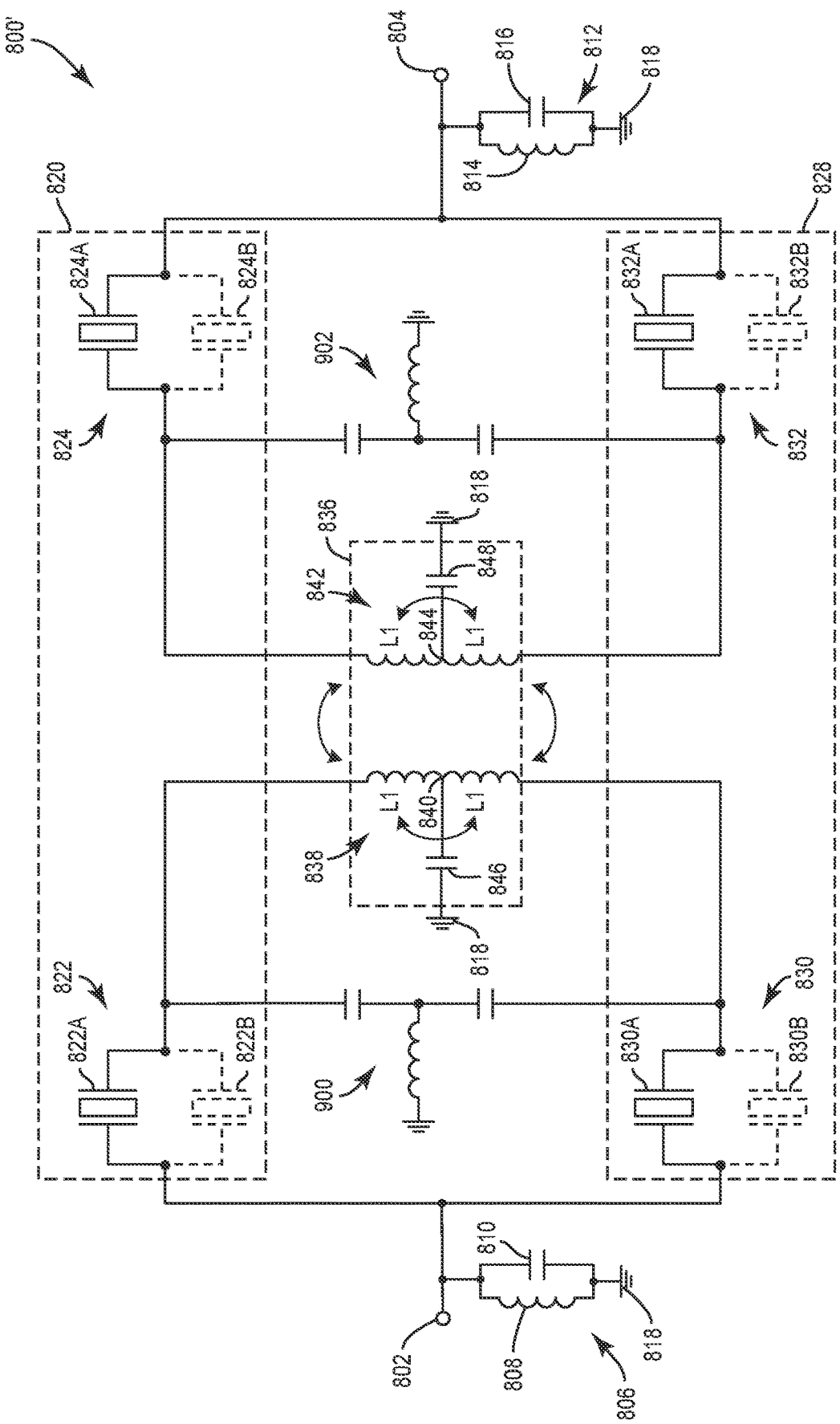
FIG. 9 is a circuit diagram of an alternate filter using the transformer of FIG. 8 and a higher order common mode rejection network.

Instead of using the inductors to couple the nodes in the impedance paths, a transformer may be used as illustrated in FIGS. 8 and 9. The primary and secondary windings of the transformer may have center taps. The common mode impedance of the primary and/or secondary windings may be resonated by a resonant circuit such as a capacitor to ground on the center tap. This structure may provide three sources of common mode rejection: the resonance of the primary winding, the resonance of the secondary windings, and the common mode rejection of the transformer structure. It should be appreciated that the resonance of the primary and secondary windings may be placed at different frequencies to give rejections in different bands.

In this regard, FIG. 8 illustrates a filter 800. The filter 800 includes an input node 802 and an output node 804. The filter 800 further includes an input LC circuit 806 formed from an inductor 808 and a capacitor 810. The filter 800 further includes an output LC circuit 812 formed from an inductor 814 and a capacitor 816. The input LC circuit 806 and the output LC circuit 812 couple to a ground 818.

The filter 800 further includes a first impedance path 820 between the input node 802 and the output node 804. The first impedance path 820 includes a first impedance 822. The first impedance 822 may be formed from a BAW resonator 822A, and optionally an electrically parallel BAW resonator 822B. The first impedance path 820 further includes a second impedance 824 formed from a BAW resonator 824A and optionally an electrically parallel BAW resonator 824B.

The filter 800 further includes a second impedance path 828 between the input node 802 and the output node 804. The second impedance path 828 is electrically parallel to the first impedance path 820. The second impedance path 828 includes a third impedance 830. The third impedance 830 may be formed from a BAW resonator 830A, and optionally an electrically parallel BAW resonator 830B. The second impedance path 828 further includes a fourth impedance 832 formed from a BAW resonator 832A and optionally an electrically parallel BAW resonator 832B.

The filter 800 further incudes a transformer 836 having a first coil 838 with a first center tap 840 and a second coil 842 having a second center tap 844. The existence of the taps 840 and 844 allow the coils 838 and 842 to be thought of as two separate inductors coupled to one another. The first impedance 822 couples the input node 802 to the first coil 838. The second impedance 824 couples the second coil 842 to the output node 804. The third impedance 830 couples the input node 802 to the first coil 838. The fourth impedance 832 couples the second coil 842 to the output node 804. The transformer 836 couples the first impedance 822 to the second impedance 824. The transformer 836 also couples the third impedance 830 to the fourth impedance 832.

A capacitor 846 may couple the first center tap 840 to ground 818. A capacitor 848 may couple the second center tap 844 to ground 818. As discussed above, there may be couplings between the windings on either side of the center taps 840, 844 as well as between the coils 838, 842. Collectively, these resonances provide desired notch frequencies.

FIG. 9 is similar but adds resonant circuits 900, 902 to form filter 800'. The resonant circuit 900 is electrically parallel to the first coil 838. The resonant circuit 902 is electrically parallel to the second coil 842. The resonant circuits 900, 902 may be formed by serial capacitors and an inductor to ground similar to the arrangement discussed in the filter 700 of FIG. 7 and thus may be considered LC circuits.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. A filter comprising:
   a first impedance path between an input node and an output node, the first impedance path comprising a first impedance and a second impedance serially connected to one another and defining a first node therebetween;
   a second impedance path between the input node and the output node, the second impedance path electrically parallel to the first impedance path, the second impedance path comprising a third impedance and a fourth impedance serially connected to one another and defining a second node therebetween, the first impedance path and the second impedance path comprising a reversed semilattice filter;
   a first inductor coupled the first node;
   a second inductor serially coupling the first inductor to the second node; and
   a resonant circuit associated with the first inductor and the second inductor, the resonant circuit configured to lower a common mode impedance for the filter at a predetermined notch frequency.

2. The filter of claim 1, wherein the first inductor is inductively coupled to the second inductor.

3. The filter of claim 1, wherein the resonant circuit comprises a capacitor coupled from a third node between the first inductor and the second inductor to ground.

4. The filter of claim 3, wherein the first impedance comprises a resonator.

5. The filter of claim 4, wherein the resonator comprises a bulk acoustic wave (BAW) resonator.

6. The filter of claim 3, wherein the first impedance comprises a first resonator and a second resonator electrically parallel to the first resonator.

7. The filter of claim 3, wherein the resonant circuit further comprises an LC circuit between the first node and the second node, the LC circuit electrically parallel to the first inductor and the second inductor.

8. The filter of claim 7, wherein the LC circuit comprises:
   a second capacitor;
   a third capacitor serially coupled to the second capacitor between the first node and the second node with an LC node therebetween; and
   a third inductor coupling the LC node to ground.

9. The filter of claim 1, wherein the resonant circuit comprises:
   a third inductor coupled to a third node between the first inductor and the second inductor;
   a first capacitor serially coupled to the third inductor and ground; and
   a second capacitor electrically in parallel to the third inductor and the first capacitor.

10. A filter comprising:
    a transformer comprising a first coil having a first center tap and a second coil having a second center tap;
    a first impedance path comprising:
       a first impedance coupling an input node to the first coil; and
       a second impedance coupling the second coil to an output node;
    a second impedance path comprising:
       a third impedance coupling the input node to the first coil, the third impedance electrically parallel to the first impedance; and a fourth impedance coupling the second coil to the output node, the fourth impedance electrically parallel to the second impedance, wherein collectively, the first impedance path, the second impedance path, and the transformer comprise a reversed semilattice filter;

the transformer coupling the first impedance to the second impedance;

the transformer coupling the third impedance to the fourth impedance; and a resonant circuit associated with the first center tap, the resonant circuit configured to lower a common mode impedance for the filter at a predetermined notch frequency.

11. The filter of claim 10, further comprising a second resonant circuit associated with the second center tap, the second resonant circuit configured to lower the common mode impedance for the filter at a second predetermined notch frequency.

12. The filter of claim 10, wherein the resonant circuit comprises a capacitor coupling the first center tap to ground.

13. The filter of claim 12, further comprising an LC circuit electrically parallel to the first coil.

14. The filter of claim 13, wherein the LC circuit comprises:
a first capacitor;
a second capacitor serially positioned relative to the first capacitor with a node therebetween; and
an inductor coupling the node to ground.

15. The filter of claim 14, further comprising a second LC circuit electrically parallel to the second coil.

16. The filter of claim 10, wherein the first coil comprises a first inductor and a second inductor, wherein the first inductor is inductively coupled to the second inductor.

17. The filter of claim 10, wherein the first impedance comprises a resonator.

18. The filter of claim 17, wherein the resonator is a bulk acoustic wave (BAW) resonator.

19. A filter comprising:
a first impedance path between an input node and an output node, the first impedance path comprising a first impedance and a second impedance serially connected to one another and defining a first node therebetween;
a second impedance path between the input node and the output node, the second impedance path electrically parallel to the first impedance path, the second impedance path comprising a third impedance and a fourth impedance serially connected to one another and defining a second node therebetween, the first impedance path and the second impedance path comprising a reversed semilattice filter;
a first inductor coupled the first node;
a second inductor serially coupling the first inductor to the second node and defining a third node between the first inductor and the second inductor; and
a capacitor coupling the third node to ground to lower a common mode impedance for the filter at a predetermined notch frequency.

* * * * *